United States Patent [19]

Perino et al.

[11] Patent Number: 5,426,075
[45] Date of Patent: Jun. 20, 1995

[54] METHOD OF MANUFACTURING FERROELECTRIC BISMUTH LAYERED OXIDES

[75] Inventors: Stanley Perino; Thomas E. Davenport, both of Colorado Springs, Colo.

[73] Assignee: Ramtron International Corporation, Colorado Springs, Colo.

[21] Appl. No.: 259,870

[22] Filed: Jun. 15, 1994

[51] Int. Cl.[6] .............................................. H01L 21/02
[52] U.S. Cl. ........................................ 437/235; 437/52;
204/192.15; 204/192.22
[58] Field of Search ....................... 204/192.15, 192.22;
437/235, 52

[56] References Cited

U.S. PATENT DOCUMENTS 5,041,200  8/1991  Ishii ................................. 204/192.15

FOREIGN PATENT DOCUMENTS

| 145204 | 6/1986 | Japan | G11B 11/10 |
| 171223 | 1/1989 | Japan . | |
| WO93/12538 | 6/1993 | WIPO | H01L 21/31 |
| WO93/12542 | 6/1994 | WIPO | H01L 27/11 |

OTHER PUBLICATIONS

M. H. Francombe, W. J. Takei & N. P. Formigoni, "Growth and Properties of Epitaxial Films of Ferroelectric Bismuth Titanate", Air Force Avionics Laboratory, Feb. 1970.
M. H. Francombe, W. J. Takei & S. Y. Wu, "Growth and Properties of Epitaxial Films of Ferroelectric Bismuth Titanate", Air Force Avionics Laboratory, Apr. 1970.
M. H. Francumbe & S. V. Krishnaswamy, Growth and Properties of piezoelectric and ferroelectric films:, *J. Vac. Sci. Tech.,* A8(3), May, Jun. 1990.
K. Wasa & S. Hayakawa, *Handbook of Sputter Deposition Technology-Principles, Technology and Application,* pp. 220–221.
Spry "Dielectric Optical Switch" May 4, 1993 FIG. 1 & col. 3.

*Primary Examiner*—Brian E. Hearn
*Assistant Examiner*—Trung Dang
*Attorney, Agent, or Firm*—Peter J. Meza; Alexander C. Johnson, Jr.

[57] ABSTRACT

A semiconductor manufacturing method is directed to forming a ferroelectric film, and in particular a ferroelectric film of the bismuth layer structure type, that has a significant component of reversible polarization perpendicular to the plane of the electrodes. The manufacturing method is conducted at low temperatures on commercially suitable electrodes and is compatible with conventional CMOS fabrication techniques. A ferroelectric strontium-bismuth-tantalate ("SBT") film is formed using two sputtering targets. A first sputtering target is comprised primarily of bismuth oxide ($Bi_2O_3$) and a second sputtering target is comprised primarily of SBT. An initial layer of bismuth oxide is formed on the bottom electrode of a ferroelectric capacitor stack. The initial layer of bismuth oxide is directly followed by a sputtered layer of SBT. A second layer of bismuth oxide is then applied and the layers are alternated in a "layer cake" fashion containing a plurality of layers until a desired thickness of the film is attained. At the end of the deposition, a crystallization anneal is performed to make the film ferroelectric. Once the ferroelectric film is in place, the top electrode is formed and the remaining processing steps are completed.

20 Claims, 7 Drawing Sheets

FIG. IA
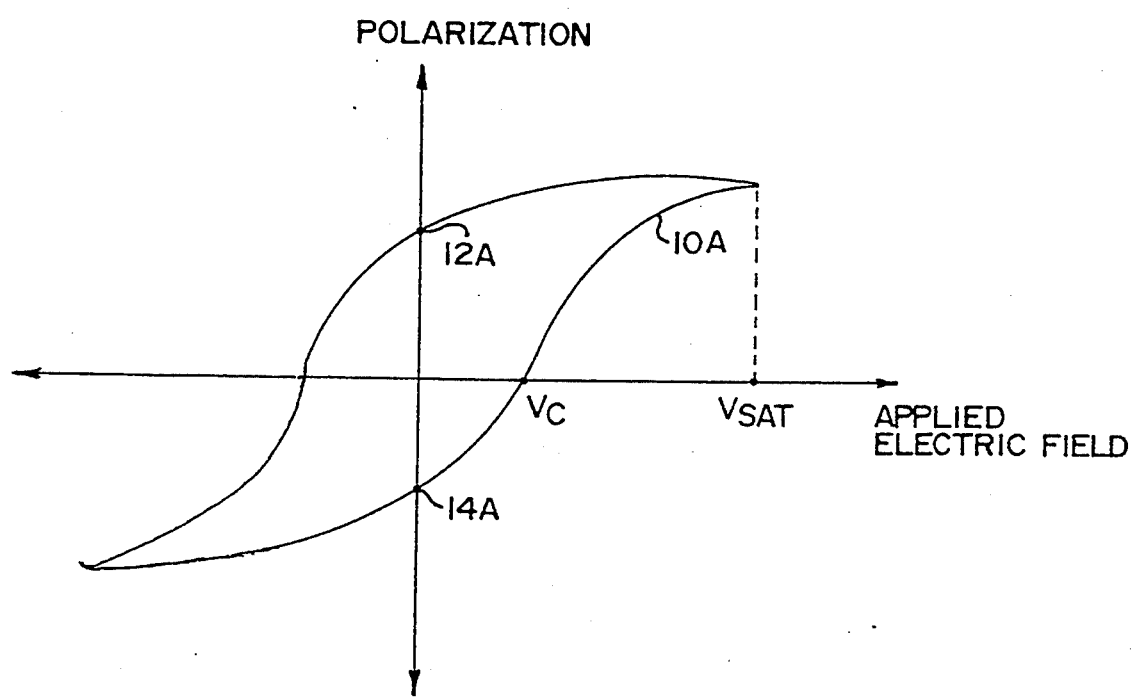
FIG. IB
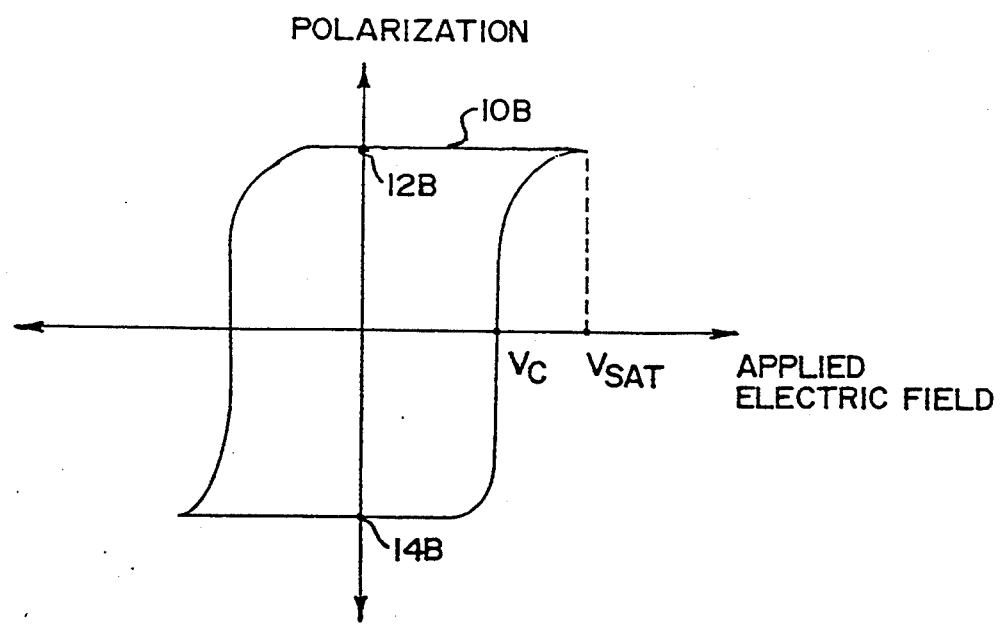

METHOD OF MANUFACTURING FERROELECTRIC BISMUTH LAYERED OXIDES

BACKGROUND OF THE INVENTION

This invention relates generally to a method of forming a ferroelectric film for use as the dielectric of a capacitor memory element for a nonvolatile memory. More particularly, the present invention relates to a manufacturing method using bismuth layered oxide compounds having the desirable electrical characteristic that is compatible with conventional integrated circuit processing.

It is well known that certain materials such as lead zirconate titanate ($PbZr_xTi_{1-x}O_3$), which is also known as "PZT", are "ferroelectric" in that they can retain a reversible electric polarization in the absence of an applied electric field. Typically, these compounds exist as polycrystalline materials containing grains of perovskite crystalline material.

Other compounds, such as the bismuth layered compounds are also ferroelectric. The structure of bismuth layered compounds consists of layers of perovskite, infinite in two dimensions, separated from each other by a bismuth oxide layer. The perovskite layer can be one, two, three or more perovskite unit cells thick. Each of these thicknesses results in a separate structure type, but has the perovskite layer-bismuth oxide layer alternation, giving rise to the term bismuth "layered" compounds. Examples of ferroelectric bismuth layered compounds include bismuth titanate ($Bi_4Ti_3O_{12}$) and strontium bismuth tantalate ($SrBi_2Ta_2O_9$), which is also known as "SBT", as well as many others.

The reversible polarization of a ferroelectric material film, for example, must be in a direction perpendicular to the plane of electrodes that transfer the applied electric field to the film so that an appreciable amount of charge can be detected. A stable polarization results from the alignment of internal dipoles with the perovskite crystal units in the ferroelectric material. Application of the electric field across a ferroelectric material causes the alignment of the dipoles in one direction. Reversal of the polarity of the applied field also reverses, or switches, the alignment of the internal dipoles. Application of an electric field exceeding a critical level known as the "coercive voltage", VC, causes dipoles within the ferroelectric material to begin alignment, as is shown in the hysteresis curve 10A of FIG. 1A. An increase in the applied electric field results in a saturation level known as the "saturation voltage", VSAT, wherein substantially all of the dipoles within the ferroelectric material have been polarized in one direction. In FIG. 1A, the coercive voltage is about 1.3 volts and the saturation voltage is about five volts. Note that hysteresis curve 10A has a distended shape, which is indicative of a poorly defined coercive voltage, i.e. many of the dipoles have not yet been switched at the coercive voltage level of applied electric field.

Hysteresis curve 10A therefore demonstrates the electrical behavior of a ferroelectric material such as PZT wherein the x-axis represents the applied electric field and the y-axis represents the resultant polarization or charge. Two stable states 12A and 14A are shown in FIG. 1A, which represent opposite alignments of the internal dipoles after the applied electric field has been removed. The amount of charge released in moving between stable states 12A and 14A is known as the "switched charge." It is also known that the rate of alignment of the dipoles is related to the overdrive voltage, i.e. the amount by which the applied voltage exceeds the coercive voltage. The position of the dipoles and the associated electric charge in response to an applied electric field can be detected with appropriate sensing circuitry. Ferroelectric materials, therefore, can be used as the dielectric material in a ferroelectric capacitor that in turn is used as the memory element in a nonvolatile memory cell.

Hysteresis curve 10B in FIG. 1B demonstrates the electrical behavior of a ferroelectric material such as SBT wherein the x-axis represents the applied electric field and the y-axis represents the resultant polarization or charge. In the hysteresis curve 10B, the coercive voltage is about one volt and the saturation voltage is about 2.5 volts. Note that hysteresis curve 10B has a roughly square shape, which is indicative of a well defined coercive voltage, i.e. most of the dipoles have been switched at the coercive voltage level of applied electric field. As in FIG. 1A, two stable states 12B and 14B are shown in FIG. 1B, which represent opposite alignments of the; internal dipoles after the applied electric field has been removed.

To be useful, a ferroelectric material in a memory array must have the ability to retain data when repeatedly switched between the two stable data states 12A and 14A as shown in FIG. 1A, or data states 12B and 14B as shown in FIG. 1B. Conventional non-volatile memory cells such as EEPROMs are non-destructive readout devices in that reading the data state does not change that data state. Conventional non-volatile memories allow an unlimited number of read cycles, but a very limited number of write cycles Ferroelectric memory devices are typically destructive readout devices in that switching occurs for each reading of the data. Consequently, it is desirable that the number of cycles before failure of the ferroelectric memory cell be very much higher than that for EEPROMs or on the order of magnitude of one billion or one trillion cycles.

It is also desirable in many applications for the ferroelectric memory cell to operate at low voltage such as 3.3 volts. Thus, the coercive voltage should be significantly lower than the desired operating voltage of the memory. The minimum voltage at which the switched charge reaches its maximum value, the saturation voltage, should also be about the same as or lower than the desired operating voltage for optimum performance. It is further desirable that the ferroelectric material in a memory array retain a data state over prolonged periods of time at elevated temperatures. Ideally, retention of a data state should be independent of the state of prior data storage. The bismuth layered ferroelectric compounds referred to above are thus ideally suited for a ferroelectric memory application because of their desirable cycling, low voltage, and retention properties.

While ferroelectric bismuth compounds are well suited to operation in a memory because of their electric characteristics, they are difficult to manufacture as a capacitor dielectric material in a typical semiconductor processing flow. A classical method of depositing bismuth titanate, or other bismuth ferroelectric materials, is to sputter the material from a single target at elevated temperatures onto crystalline planes of a substrate oxide. The substrate oxide is chosen so that the lattice dimensions are matched to the lattice dimensions of the ferroelectric bismuth compound, which results in a crystalline film that is ferroelectric. The classical sputter deposition method suffers from several shortcomings.

The requirement of lattice matching severely restricts the possible choices of substrates. The common substrates used to lattice match with the ferroelectric film, such as aluminum oxide, lanthanum aluminum oxide, magnesium aluminum oxide or magnesium oxide, are not conductive. In order to fabricate a capacitor, conductive electrodes are required in order to apply an electric field across the ferroelectric film. To use these films on insulating lattice matched oxide substrates, the ferroelectric film must be physically peeled from the substrate and electroded. After separation from the substrate, the films are very fragile and difficult to handle. Therefore the process of using such films is very difficult and unsuitable for fabrication of conventional nonvolatile memories. It is conceivable that there might exist a conductive oxide that could also provide lattice matching, but the known conductive oxides suffer from poor conductivity, thermal instabilities, and complex fabrication methods.

Another shortcoming of the classical method is the requirement of elevated deposition temperatures, e.g. 500° to 700° C. These very high temperatures add complexity and impose severe constraints on the deposition equipment. The high temperatures also can degrade the bottom electrode surface flatness due to hillock formation.

Alternative prior art spin-on deposition methods, such as sol gel or metal organic deposition, may yield switching bismuth layered oxide films on conductive electrodes, but these methods also suffer from several shortcomings. The orientation of grains and grain size of the deposited film might not be suitable or controllable when used on bottom electrodes suitable for conventional integrated circuit processing, resulting in a low grade ferroelectric material that yields little switched charge. Furthermore, these spin-on deposition methods suffer from practical incompatibilities with the processing techniques used in the fabrication of conventional semiconductor integrated circuit non-volatile memories. Spin-on deposition planarizes the surface topography on top of an integrated circuit by becoming thicker in the troughs and thinner at elevated surface features. This non-uniform film thickness deposition causes problems during subsequent patterning steps, resulting in regions of under etching and regions of over etching. Another problem with spin-on deposition techniques is that the availability of suitable precursor solutions is not as commercially developed as the availability of sputter targets for the deposition process referred to above. The purity requirement of near zero mobile ion content is readily achieved with commercially available metal oxide powders used for sputtering targets, but remains a challenge for spin-on sources. The spin-on process is susceptible to a host of additional problems such as precipitation of detrimental particles in the solution or during application, streaking, poor adhesion, and film cracking due to volumetric changes during solvent evolution bakes.

Another alternative prior art deposition method is the technique of "co-deposition" in which two or more targets are used, primarily to control the composition of a deposited film. Typically, the deposition from multiple targets is either done simultaneously or separately, but in the latter case with extremely thin layers. The layer thickness may be only a few Angstroms thick, in which case there is an effective mixing of layers to form a homogeneous film composition. This technique, as now commonly practiced, is not useful for forming bismuth layered ferroelectric films. While the resultant film composition is made of the desired constituent elements, and in the proportions required, the film is not ferroelectric. It is speculated that initial orientation of the crystal grains, or perhaps other properties of the film, result in a polarization axis that is not perpendicular to the plane of the metal electrodes in contact with the film. The capacitors made with such a film, therefor, are not ferroelectric in that a significant switched charge as can be detected with a conventional sense amplifier is not produced in response to an applied electric field.

A need remains, therefore, for a method for the formation of desirable bismuth ferroelectric layers with consistent desirable electrical properties that is readily integrated and compatible with conventional complementary metal oxide semiconductor transistor ("CMOS") processing.

SUMMARY OF THE INVENTION

It is, therefore, an object of the present invention to produce ferroelectric films, and in particular, bismuth layered ferroelectric films with a large amount of reversible polarization in a direction perpendicular to the plane of electrodes attached to the film.

Another object of the invention is to provide a deposition method that is compatible with conventional integrated circuit processing techniques.

An advantage of the invention is that it can be applied to a wide variety of ferroelectric compounds and in particular to bismuth layered ferroelectric compounds that have desirable electrical properties.

It is another advantage of the invention that the preferred deposition method is independent of the specific characteristics of the substrate or bottom electrode.

The present invention is a semiconductor manufacturing method for forming a ferroelectric film, and in particular, a ferroelectric film of the bismuth layered structure type, that has a significant component of reversible polarization perpendicular to the plane of the electrodes attached to that film. The manufacturing method is conducted at low temperatures on commercially suitable electrodes and is compatible with conventional CMOS fabrication techniques. The present invention includes a sputtering process that uses multiple sputtering targets and sequential deposition to form a precursor film in thin but distinct and unmixed layers, which is subsequently annealed to convert the the distinct layers into a composite ferroelectric film. The capacitors made with such a film are ferroelectric in that a significant switched charge (at least five $uC/cm^2$) can be detected with a conventional sense amplifier in response to an applied electric field.

In a preferred embodiment of the invention, a ferroelectric SBT film is formed using two sputtering targets. A first sputtering target is comprised primarily of bismuth oxide ($Bi_2O_3$) and a second sputtering target is comprised primarily of SBT ($SrBi_2Ta_2O_9$). An initial layer of bismuth oxide is formed on a bottom electrode of a ferroelectric capacitor stack. The initial layer of bismuth oxide is directly followed by a sputtered layer of bismuth deficient SBT. A second layer of bismuth oxide is then applied and the layers are sequentially alternated in a "layer cake" fashion containing a plurality of layers until a desired thickness of the film is attained. At the end of the deposition, a crystallization anneal is performed to make the film ferroelectric. It is inferred that the "layer cake" structure is necessary, once annealed, to properly orient the grains of the polycrystalline film. Once the ferroelectric film is in place, a top electrode is formed and all remaining semiconductor processing steps are completed.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1A is a plot of a hysteresis curve associated with a ferroelectric material such as PZT having a poorly defined coercive voltage;

FIG. 1B is a plot of a hysteresis curve associated with a bismuth layered ferroelectric material such as SBT having a well defined coercive voltage;

DETAILED DESCRIPTION

According to the present invention, a sputtering deposition method is described for creating ferroelectric films from bismuth layered oxide or other such compounds that is compatible with conventional semiconductor fabrication techniques.

Two Target Method According to the Present Invention

Figure 2:
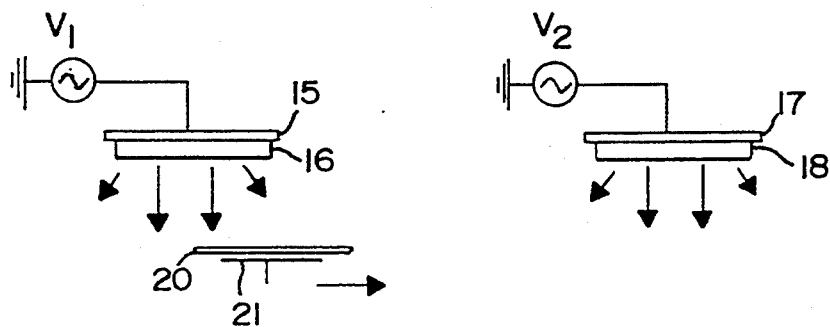
FIG. 2 is an illustration of sequential sputter deposition from two targets of different compositions.

Referring now to FIG. 2, the fundamentals of a two-target sputtering technique according to the present invention are described with reference to targets 16 and 18, and a substrate 20, such as a silicon wafer. A ferroelectric film, which cart be formed of bismuth layered materials such as SBT or other ferroelectric materials, is formed using multiple targets 16 and 18 in a sputter deposition process, which is followed by a crystallization anneal. The source material from which a thin film is deposited in a sputtering system is known as the target. The target 16, 18 is typically bonded to a copper disc, known as the backing plate (not shown in FIG. 2), by either silver epoxy or indium and tin solder. The backing plate is mechanically attached to a cathode assembly that houses a cathode, such as cathode 15 and 17 for receiving electrical power, magnets and cooling water (the latter two elements are not shown in FIG. 2). The cathode 15, 17 is electrically connected to a power supply such as power supplies $V_1$ and $V_2$. If, as with SBT or other bismuth ferroelectric compounds, the target 16, 18 is electrically insulating, then a radio frequency ("RF") power supply with an impedance matching network is used to electrically bias the target. The negative bias developed on the target causes positively charged ions in a plasma contained within the sputtering system to bombard the target 16, 18 with sufficient energy to knock off, or sputter, atoms from the target. A portion of the sputtered atoms stick to a substrate 20 such as a silicon integrated circuit wafer and gradually form a deposited film. Consequently, the composition of the deposited film is related to the composition of the target. The film and target composition may differ considerably in detail since tile sputtered atoms must actually reach and stick to the substrate 20.

More than one target is used in the sputtering process of the present invention for the deposition of discrete individual material layers. Deposition from two targets 16 and 18 to a substrate 20, which can be a six inch processed silicon wafer, for example, is illustrated in FIG. 2, but other numbers of targets can be used, as is further discussed below. Each target 16 and 18 is electrically biased by attached cathodes 15 and 17, respectively, which are in turn energized by respective RF power supplies $V_1$ and $V_2$. Shielding around targets 16 and 18 (not shown in FIG. 2) and the relative spacing between targets 16 and 18 and substrate 20 reduce mixing of the sputtered material in the deposition chamber. Substrate 20 is movable, and supported beneath and transported between each target 16 and 18 via wafer support 21 to enable the formation of a film with alternating discrete layers of differing composition by sequential deposition from each target 16, 18.

A target such as target 16 and 18 shown in FIG. 2 must be mechanically robust enough to withstand thermal gradients developed by the sputtering process and the associated water cooled cathode. Also, the mobile ion content of the target from contaminating compounds such as lithium, sodium, and potassium is desirably very low due to the semiconductor application. An insulating or oxide target can be fabricated by conventional ceramic fabrication methods. Commercially available high purity metal oxide powders are weighed according to the desired target composition. After mechanically mixing the individual powders, the combined powder is contained in a graphite die and subjected to high pressure at elevated temperatures in a hot press to consolidate the powder into a single ceramic piece. The target can be a mixture of reaction products, or material phases, formed during the hot pressing.

It is also possible to form a target of a single phase material by a different conventional method. In this method, the starting powders are mixed and fully reacted in a furnace. The reacted powder is milled to a fine size and, in order to minimize mobile ion contamination, a binder is not added. The powder is consolidated by a cold press to a low density, or green, ceramic piece. The piece is then sintered at high temperatures for long times to increase density and mechanical integrity.

Either of these two methods yields a ceramic target suitable for use with the method of the present invention, although the avoidance of a binder in the second method may negatively impact mechanical integrity.

The preferred compositions of the two targets 16, 18 used in a first method of the present invention are bismuth oxide, $Bi_2O_3$ and SBT, $Sr_1Bi_2Ta_2O_9$. The size of the bismuth oxide target is ideally 2.73 inches in diameter by 0.25 inches thick mounted on a three inch diameter copper backing plate. The size of the SBT target is ideally 4.73 inches in diameter by 0.25 inches thick mounted on a five inch diameter copper backing plate. The stated purity level of the SBT target can be as low as 0.995 due to a typically high content of barium in the strontium and, to a lesser extent, traces of niobium in the tantalum.

Figure 3:
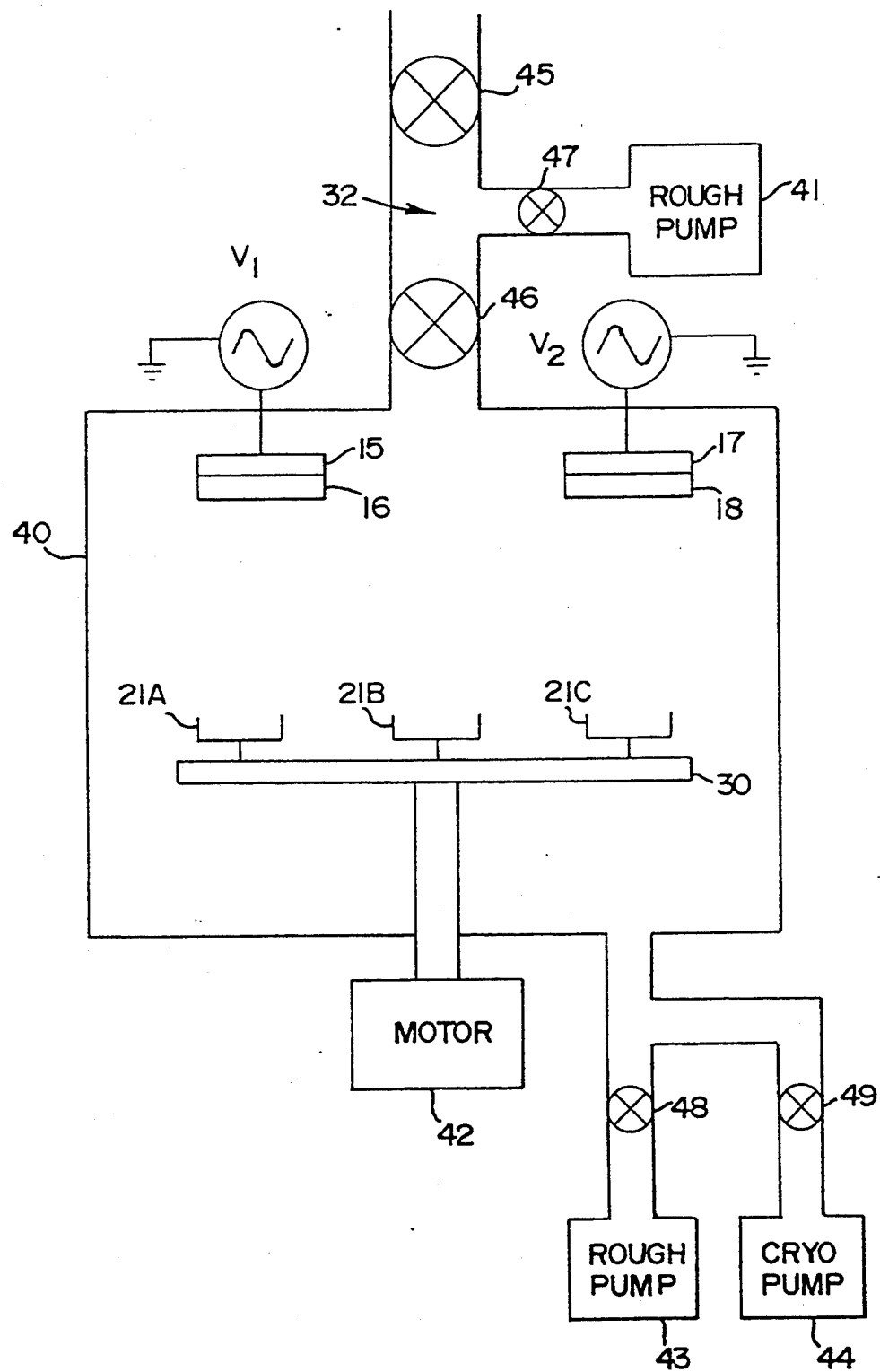
FIG. 3 is a diagram of a multiple-target sputtering system according to the present invention.

A multiple-target sputtering, system for use in the sputtering method of the present invention is illustrated in FIG. 3. The preferred sputtering system includes a PVD-300 physical vapor deposition system manufactured by Unifilm Technology, Inc. of Boulder, Colo., although other commercially available sputtering equipment can be adapted and used. A deposition chamber 40 is equipped with a mechanical roughing pump 43 and a high vacuum cryogenic pump 44. Sequential operation of the roughing pump 43 and cryogenic pump 44 is controlled through valves 48 and 49.

The sputtering system of FIG. 3 preferably includes a load lock chamber 32 that allows load lock operation when introducing substrates or wafers into the deposition chamber 40. A wafer, for example, is introduced into the load lock chamber 32 by means of a valve 45. Once in the load lock chamber 32, a valve 47 is opened, which allows roughing pump 41 to pull a vacuum in chamber 32. Once a vacuum has been established, valve 46 is opened and the wafer is introduced into deposition chamber 40 by mechanical means (not shown in FIG. 3).

Two cathodes 15 and 17 are shown in FIG. 3, but as many as four can be used. The number of cathodes and corresponding targets is linked to the type of equipment used. The number of cathodes, therefore, may be increased if permitted by the available locations in the equipment used. The operation of a four cathode/four target system is described in further detail below. The cathodes 15 and 17 shown in FIG. 3 are ideally manufactured by the Kurt J. Lesker Company of Clairton, Pa. and by Vacuum Incorporated of Boulder, Colo. Each cathode 15 and 17 is powered by a separate 13.54 megahertz radio frequency power supply designated. $V_1$ and $V_2$. Ideally, power supplies and matching networks manufactured by the Plasmatherm Company of Kresson, N.J. are used for independent power control. The cathodes 15 and 17, and attached targets 16 and 18, are positioned in a circle above the substrate transport mechanism 30. The target to substrate distance is about 1.75 inches for the 4.73 inch diameter targets, and the target to substrate distance is about 3.5 inches for the 2.73 inch diameter target. The substrate transport mechanism 30 is rotated by motor 42 and is controlled to provide a uniform deposited film thickness and target selection. This control process is explained in greater detail below with reference to FIGS. 4 and 5. Substrate transport mechanism 30 also includes a number of wafer supports of which wafer supports 21A, 21B, and 21C are shown. All wafer supports are rotated and controlled together as a group.

Figure 4:
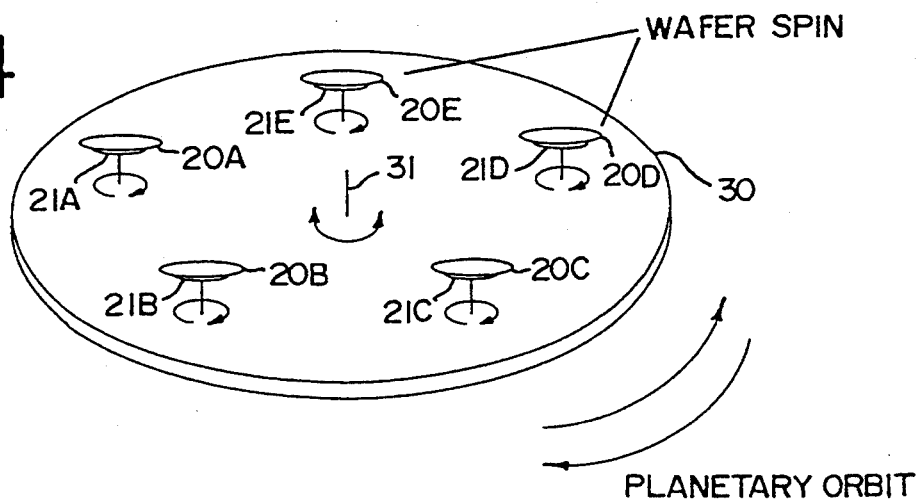
FIG. 4 is a diagram of the substrate transport mechanism of the sputter deposition system shown in FIG. 3 showing the planetary orbit and the wafer spin.

The substrate transport mechanism 30 is shown in perspective view in FIG. 4. It can be seen in FIG. 4 that transport mechanism 30 holds up to five substrates 20A through 20E arranged in a circular pattern on corresponding individual rotatable wafer holders or planets 21A through 21E. Transport 30 is computer controlled and is capable of two types of motion. Each planet 21A through 21E can rotate or spin about its axis on transport 30. All planets 21A through 21E can also orbit in either a clockwise or counter clockwise direction as a unit around central axis 31 of transport 30.

Returning to FIG. 3, at the beginning of the deposition process of the present invention, one or more substrates or wafers 20 are loaded into the vacuum deposition chamber 40 by means of load lock chamber 32 followed by a pause of a few minutes to return to a base pressure of less than 5E-7 Torr. The substrate holders 21A–C are preferably not heated by a substrate heater although the sputter process does raise the substrate temperature somewhat. The vacuum pump 44 is throttled down and the deposition chamber 40 is back filled with argon. After positioning the substrate 20 away from the direct Spray of either target 16 or 18, power is applied to each target 16 or 18 and a plasma is ignited. A time period of about fifteen seconds is used to establish the desired target powers and effectively serves as a presputter period to clean the target surfaces of any background gas accumulation. A computer controlled mechanical substrate scanning program is subsequently started that sequentially moves the substrate beneath each target in a well defined fashion to accumulate discrete individual layers of differing composition from each target. The scanning program is described below in further detail, and particularly with respect to the program flow chart of FIG. 6 and accompanying text. Referring again to FIG. 3, after a predetermined time period the target power and argon gas is shut off, and the substrate 20 is removed from the vacuum deposition chamber 40 through the load lock chamber 32.

Figure 5:
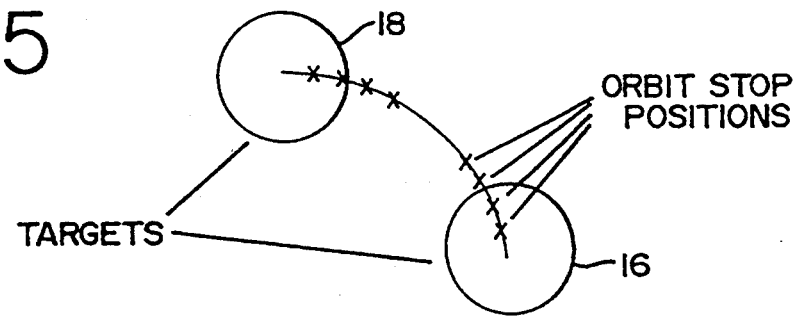
FIG. 5 is a diagram showing the locations of the orbit stop positions of the substrate transport mechanism shown in FIG. 4.

Under the control of the scanning program, only one substrate or wafer 20A through 20E at a time is coated by sputtering from one of the two biased targets 16 or 18. During all portions of the program, the substrate or wafer 20A-E is always spinning, and the spin rate is rapid enough so that at least one full spin occurs at each orbit stop. The orbit drive stops at eight different locations with four orbit stop locations (each set of four locations is denoted by an "X") symmetrically located near or beneath each target as shown in FIG. 5. It is important to note that the orbit stops as shown in FIG. 5 are not coaxial with the targets 16 and 18, as the non-coaxial locations appear to improve the yield of the sputtering process. It is speculated that the non-coaxial location lowers the energy of the sputtered material onto the surface of the wafer 20, which may have a desirable effect on the final orientation of the crystal grains in the ferroelectric material film. The time delay at each orbit stop position is adjusted to give the desired thickness uniformity across the substrate, since there is more surface area at the periphery of a wafer than at the center of a wafer. (This is primarily due to the fact that the target 16 or 18 is smaller than the wafer. The targets are about three inches in diameter, whereas the wafer 20 is about six inches in diameter. Also, recall that the spacing between the target and the wafer is as much as 3.5 inches.) After completion of the sequence of eight orbit stops, the orbit direction is reversed. The sequence is repeated until the desired number of layers and the desired overall deposited film thickness is obtained. This scan method yield is excellent across wafer uniformity, but suffers from low throughput. The low throughput is caused by not positioning the wafer directly beneath the target where deposition rate is greatest and by coating only one substrate at a time.

The orbit stop positions are used twice during each cycle of the scanning program. They are used once as the wafer moves closer toward the target and then again as the wafer moves away. This "come and go" scanning motion involves a direction reversal during each cycle of steps 108 to 114 and 116 to 122 as is explained below with respect to the scanning program flow chart shown in FIG. 6. Reversal of the orbit motion reduces the time required for deposition by eliminating extraneous orbital wafer transport through a complete rotation. The orbital and planetary motion described herein is highly dependent upon the type of deposition machine used, and can therefore be changed as desired to fit the constraints of different deposition machinery or for a different application.

Figure 6:
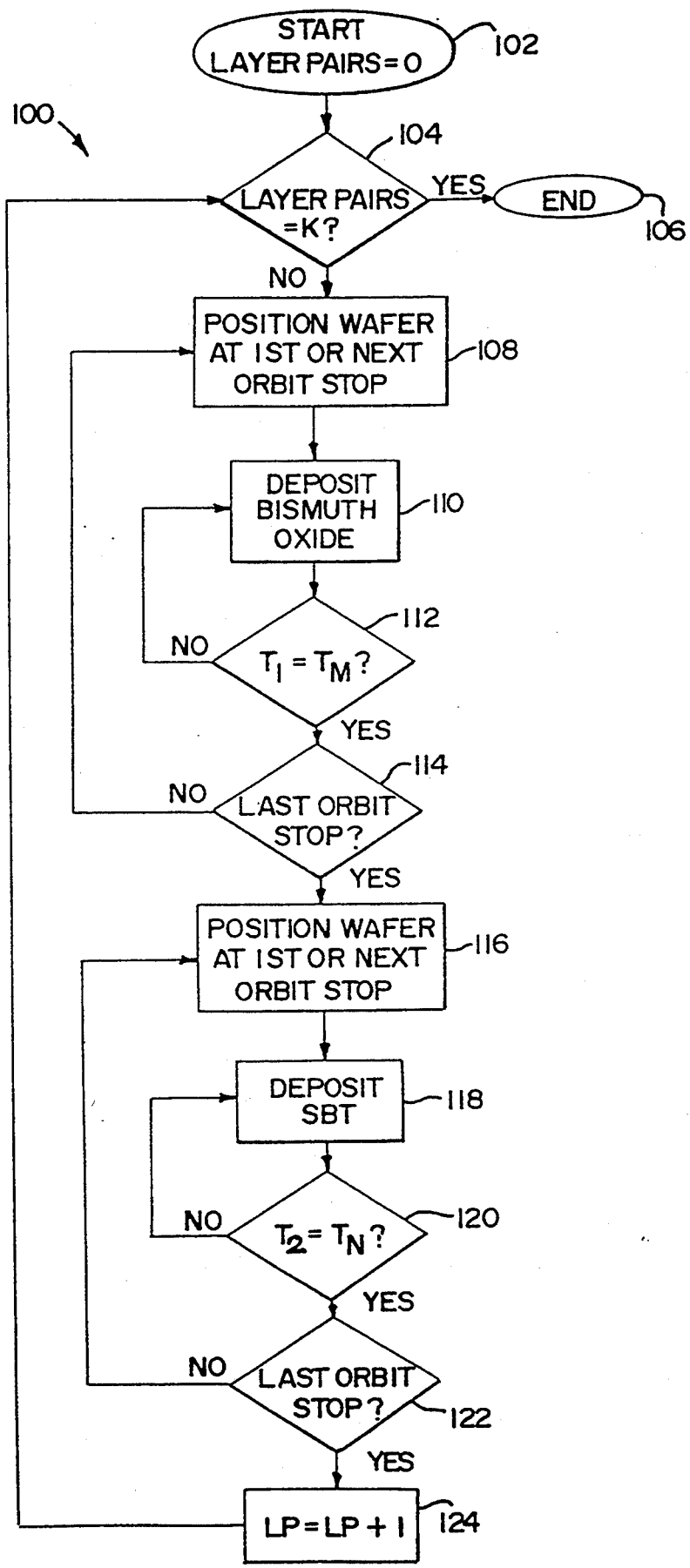
FIG. 6 is a flow diagram of a scanning program that controls the sputtering system shown in FIGS. 3–5.

The scanning program to control the two-target method of the present invention is further explained with reference to the program flow chart 100 of FIG. 6. The flow chart 100 begins at step 102 in which the number of discrete layer pairs LP is equal to zero. Decision point 104 asks whether the number of layer pairs LP is equal to a desired final number of layer pairs K. If the answer is yes, the process is ended at step 106. If the answer if no, wafer 20 is positioned at the first or next orbit stop at step 108. Once at the proper orbit stop, bismuth oxide is deposited by sputtering at step 110. Decision point 112 asks whether the deposition time $T_1$ is equal to a desired bismuth oxide deposition time $T_M$. If the answer is yes, the program continues to the last orbit stop at decision point 114. If the answer is no, the program returns to step 110 to continue the deposition. Decision point 114 asks whether the last orbit stop has been reached. If the answer is yes, the program continues to place wafer 20 at the first orbit stop for the SBT deposition. If the answer is no, the program returns to step 108 to position wafer 20 at the next orbit stop.

At step 116 the wafer 20 is placed at the proper orbit stop. SBT is subsequently deposited by sputtering at step 118. Decision point 120 asks whether the deposition time $T_2$ is equal to a desired SBT deposition time $T_N$. If the answer is yes, the program continues to the last orbit stop at decision point 122. If the answer is no, the program returns to step 118 to continue the deposition. Decision point 122 asks whether the last orbit stop has been reached. If the answer is yes, a full layer pair of bismuth oxide/SBT has been deposited and the scanning program returns wafer 20 to the first orbit stop for a new round of bismuth oxide deposition or an end to the program at decision point 104. The current status of the number of layer pairs ("LP") is incremented by one at step 124. If the answer is no, the program returns to step 116 to position wafer 20 at the next orbit stop.

A number of variables are controlled during the deposition process. The sputter gas composition is argon without added oxygen at a pressure of about 5 mTorr. The RF forward power applied to the bismuth target 16 is about 90 Watts, and the RF forward power applied to the SBT target 18 is about 200 Watts. The target powers are adjusted to control the aggregate "as-deposited" bismuth film composition to lie within 3% of a 42% optimum value as determined by ICP (inductively coupled plasma spectroscopy), i.e. 39% to 45%. The tantalum-to-strontium ratio of the aggregate as deposited film is about 2.2, and is determined by the relative tantalum to strontium content of the SBT target. In other words, the as-deposited average film composition is $Sr_{0.18}Bi_{0.42}Ta_{0.40}$. The oxygen content cannot be measured effectively by ICP. Note that the strontium-bismuth-tantalum composition is not precisely equal to the ideal formula, for SBT, which is in a 1-2-2 ration, but it is sufficiently close that the as-deposited film, when annealed, is ferroelectric. It should be noted further that a bismuth oxide target and an SBT target results in an as-deposited film having a stoichiometry close to that of SBT. The reason for this is that bismuth has a relatively poor transfer coefficient from the target to the substrate or wafer. In other words, much of the sputtered bismuth never reaches the substrate or wafer.

Figure 7A:
FIGS. 7A through 7D are cross sectional diagrams of the sputtering technique of the present invention showing the accumulation of sequentially deposited layers of different compositions.
Figure 7B:
Figure 7C:
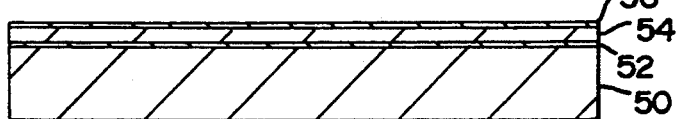
Figure 7D:
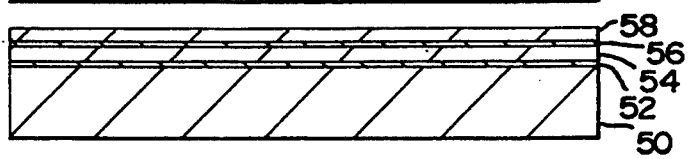

The time required to deposit a total multilayer film thickness of about 2000 Angstroms is approximately 90 minutes. The scan program spins and orbits the substrate as described with reference to FIGS. 4–6. This substrate motion produces a "layer cake" film composed of discrete individual layers as shown in FIGS. 7A through 7D. It is important not to confuse the layers of discrete material shown in FIGS. 7A through 7D with the "layer" term in bismuth layered compounds. In the former case, the layer term describes a physical thickness of the deposited material film. In the latter case, the layer term describes only the atomic level structure of the complex ferroelectric bismuth compounds, i.e. planes of perovskite crystal cells separated by a plane of bismuth oxide. In FIG. 7A, a substrate or bottom electrode 50 is shown having a single deposited layer 52 of bismuth oxide following deposition from a bismuth oxide target onto the wafer as described above. In general, bismuth oxide is always used as the initial sputtered layer to desirably control grain size and possibly orientation in the final annealed ferroelectric film. In subsequent FIG. 7B, a layer 54 of bismuth deficient SBT has been deposited on top of the initial bismuth oxide layer 52 following deposition from an SBT target onto the wafer as described above. Layers 52 and 54 together constitute a layer pair, representing one full sputtering cycle. The number of layer pairs in the film is thus equal to the number of repetitive full cycles in the scan program as described with reference to FIG. 6. In FIGS. 7C and 7D, an additional layer pair of a bismuth oxide layer 56 and an SBT layer 58 are deposited through the sputtering process. There are, therefore, two layer pairs shown in FIG. 7D. Additional layers are accumulated by multiple sputtering cycles. The combined thickness of one bismuth oxide layer and one SBT layer can be determined by measuring the total as-deposited film layer thickness and dividing by the number of cycles in the scan program. The as-deposited film thickness is adjusted to be between about 50 Angstroms and 200 Angstroms. A typical film thickness of one complete cycle (a layer pair in using a two-target process) is approximately 75 Angstroms, wherein the bismuth oxide layer is about 15 Angstroms and the SBT layer is about 60 Angstroms. Twenty-six layer pairs give a total film thickness of about 2000 Angstroms. The layer thicknesses are determined by controlling the deposition rates and deposition times in the sputtering method under control of the scan program. They may be modified if desired for a particular application.

Although the first or bottom layer of the structure may be either SBT or bismuth oxide, the preferred initial layer is bismuth oxide because a fine grain structure is produced and the electrical switching characteristics are improved. Also, the initial layer of bismuth oxide may serve to properly orient the grains in the film once it has been annealed.

Figure 8A:
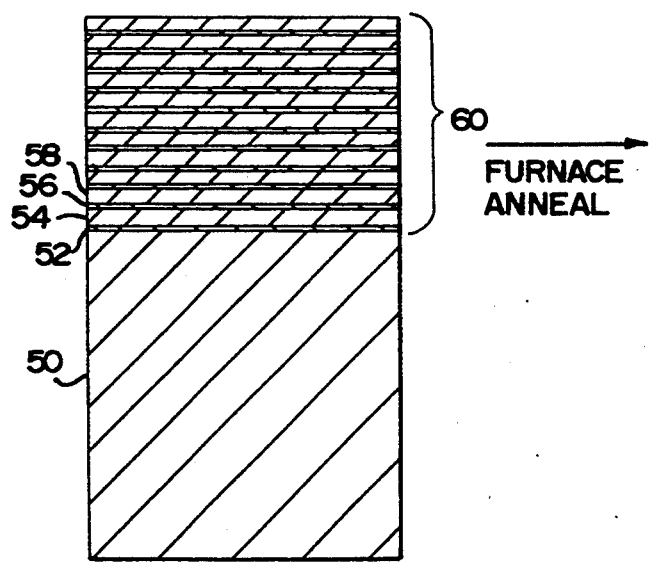
FIG. 8A is a cross sectional diagram showing a substrate with a completely fabricated ferroelectric film having discrete layers according to the method of the present invention, but before the annealling step, so that the individual film layers are visible.
Figure 8B:
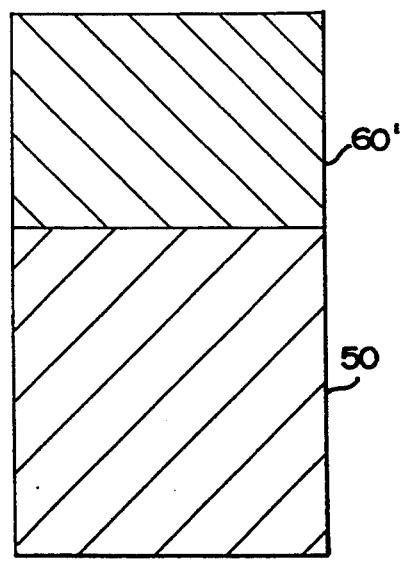
FIG. 8B is a cross sectional diagram showing the substrate and ferroelectric film of FIG. 8A after the annealling step, in which there is a dissolution of the individual film layers into a homogeneous fine grain polycrystalline film.

The as-deposited "layer cake" film structure shown in FIG. 7D must be crystallized in order to realize ferroelectric properties. This is done by furnace-annealing the intermediate product of the multilayer deposition process described above. The discrete amorphous layers are transformed into a homogeneous polycrystalline film having a structure composed of crystalline ferroelectric grains as shown in FIGS. 8A and 8B. In FIG. 8A, a substrate 50 receives a plurality (eleven layer pairs are shown) of alternately deposited layers to comprise a film 60, of which representative bismuth oxide layers 52 and 56, and bismuth deficient SBT layers 54 and 58 are labeled.

The structure shown in FIG. 8A is subsequently subjected to a crystallization anneal to establish a ferroelectric film 60'. The crystallization of layers in film 60 is accomplished by annealing in a conventional hot wall quartz tube furnace in oxygen at an approximate flow of about five liters per minute, at a temperature of about 800° C., and for a time period of about one hour.

The resulting film structure is shown in FIG. 8B. Note that the "layer cake" structure of alternating layers in film 60 is replaced with a ferroelectric film 60' that is comprised of a plurality of crystal grains, the majority of which are believed to be desirably oriented perpendicular to the surface of the substrate 50. Grain size is measured on the surface of film 60' with phase contrast optical microscopy. Preferred grain size is less than one micron in diameter. Film 60' is now ferroelectric, with a significant number of the crystal grains exhibiting switching in the axis of the applied external field (i.e. orthogonal to the plane of electrodes attached to the film 60').

The deposition method described above results in a ferroelectric film comprised of bismuth layered oxide ferroelectric compounds such as SBT. The resultant ferroelectric film primarily exhibits desirable memory cycling characteristics, low voltage operation, and retention properties. The deposition method described above also influences to a lesser extent many other desirable electrical properties such as rapid saturation of the switched charge at low voltages, stability of switched charge over time and temperature treatments, and stability of the electrical characteristics during integrated circuit processing.

Alternative Two Target Method

In this alternative method, two ceramic targets are fabricated and used in a manner similar to the previous method except that the compositions of the two targets are bismuth oxide, ($Bi_2O_3$) for the first target and strontium tantalum oxide, (formulated $Sr_1Ta_{1.75}O_{5.38}$) for the second target. The diameter of both targets is about 2.73 inches.

A newer version of a Torus cathode obtained from the Lesker company was used for the bismuth target. This cathode gives a higher deposition rate compared to the cathode used in the previously described method. The deposition system and wafer scan program used are substantially the same as described in the previous embodiment, the major difference being the composition of the second target.

The method and procedures used for deposition of the thin film are similar to that previously described, except the target power used in this method 35 Watts for the bismuth oxide target and 100 Watts for the strontium tantalum oxide target. The optimum as-deposited aggregate composition of the 'layer cake' layered structure is slightly richer in bismuth and has a composition of $Sr_{0.155}Bi_{0.47}Ta_{0.375}$. The as deposited tantalum to strontium composition ratio is about 2.4, instead of the ideal ratio of two. Since there is no bismuth component in one of the layers, the bismuth layer thickness component of the 'layer cake' structure is thicker than in the previous embodiment. Once the layers have been deposited, the material is made ferroelectric with a crystallization anneal identical to that of the previous method.

The composition of the strontium tantalum oxide target can be modified to change the composition of the as-deposited film. A strontium tantalum target, formulated $Sr_1Ta_{1.65}O_{5.38}$ achieves a tantalum to strontium composition ratio closer to the ideal of two. While two alternative two-target compositions are presented, it is appreciated that many slight alterations of the exact composition may result in an as-deposited film that is closer to the ideal SBT ratio of 1-2-2. This is especially true when all of the variations in deposition equipment and systems are taken into account for any individual sputtering system.

Alternative Four Target Method

In this alternative method, four ceramic targets instead of two are fabricated and used in a manner similar to the previously described sputtering methods. The size and compositions of the targets are: a three inch diameter bismuth oxide target; a three inch diameter strontium tantalate target, formulated as $Sr_1Ta_{1.75}O_{5.38}$; a five inch diameter bismuth oxide target; and a five inch diameter SBT target, formulated as $Sr_1Bi_2Ta_{1.9}O_{8.75}$. The disparity in size between the targets are an artifact of the deposition equipment used, and may be changed as required for other deposition equipment. The targets are arranged in the sputter system in the following sequential order: strontium tantalate; five inch bismuth oxide; bismuth strontium tantalate; and three inch bismuth oxide.

The substrate scan pattern used in this method differs from the previously described methods in that there is no reversal of the orbit direction. In this pattern, there are eight orbit stops adjacent or near each target and all five planets can be utilized simultaneous for film deposition. Each wafer is coated by all four targets in sequence as it traverses underneath, building up the discrete layers until the total film thickness is achieved. The sequence of material layers is described in further detail below.

Figure 9:
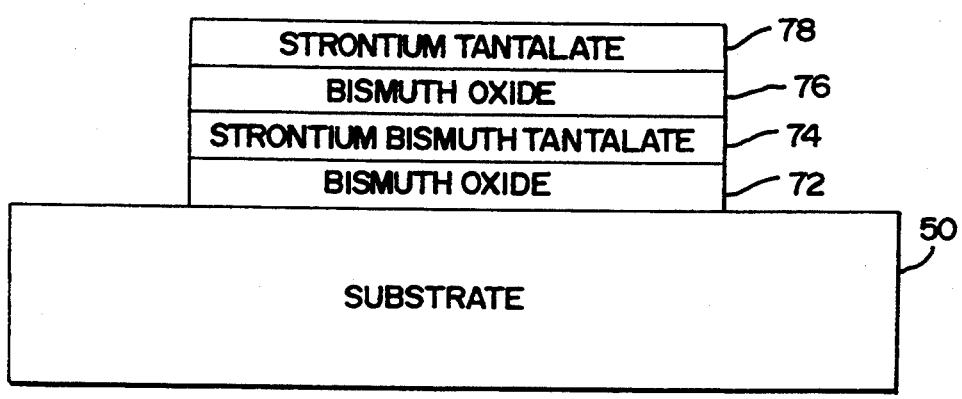
FIG. 9 is a cross sectional diagram of the first cycle of individual film layers associated with a four target alternative method of the present invention.

The periodic structure of the as deposited 'layer cake' film consists of four individual layers corresponding to the deposition of material from each target as shown in FIG. 9. The RF power applied is as follows: 35 Watts for the three inch bismuth oxide target; 100 Watts for the strontium tantalate target; 200 Watts for the strontium bismuth tantalate target; and 25 Watts for the five inch bismuth oxide target. The as-deposited composition of the film is $Sr_{0.165}Bi_{0.445}Ta_{0.40}$, giving a tantalum to strontium composition ratio of approximately 2.4.

As previously described, all targets can be powered on at the same time and then the substrate scanning program can be begun. If four substrates occupy the planets, then the first, or bottom, layer of each 'layer cake' stack will be different and correspond to each different target. Since the first layer controls the grain size that forms during the crystallization anneal, it is not desirable to use this approach, but the targets should be powered on initially in sequence so that all of the wafers receive the same bottom layer. Desirable fine grain films and orientation are obtained when the first layer is from the three inch or five inch bismuth oxide target, and undesirable coarse grain films are obtained when the first layer is either strontium tantalate or strontium bismuth tantalate. The switching characteristics of films with a first layer from the three inch bismuth oxide target are improved over films with a first layer from the five inch bismuth oxide target. Presumably this is due to some small difference in thickness or due to some other film difference arising from the differing target to substrate distances. Fine grain material is desired for uniformity of physical properties over small distances. The fine grain material can be obtained for substrates on all planets by powering on the targets sequentially in time synchronized with the orbit position so that each substrate has the same type of material in the first layer. Each of the four targets is energized in sequence, starting with a first bismuth oxide target. The power-on sequence is finished once all four targets have been turned on. After deposition of all layers to a desired thickness, a crystallization anneal is performed that is identical to that previously described.

The as-deposited layers for an ideal film deposited during one cycle of the scanning program adapted for this alternative method are shown in FIG. 9. A substrate 50 is shown, which can be the bottom electrode metallization on a silicon wafer or any other substrate. A desirable first material layer 72 is bismuth oxide, which is about 20 Angstroms thick, a second material layer 74 is SBT, which is about 90 Angstroms thick, a third material layer 76 is again bismuth oxide, which is about 20 Angstroms thick, and a fourth material layer is strontium tantalate, which is about 50 Angstroms thick. Thus, the as-deposited film thickness for one total cycle is about 180 Angstroms thick. The total film thickness is about 2000 Angstroms thick, corresponding to about eleven cycles of the scanning program or eleven sets of the four material layers.

Ferroelectric Capacitor Formation

Figure 10A:
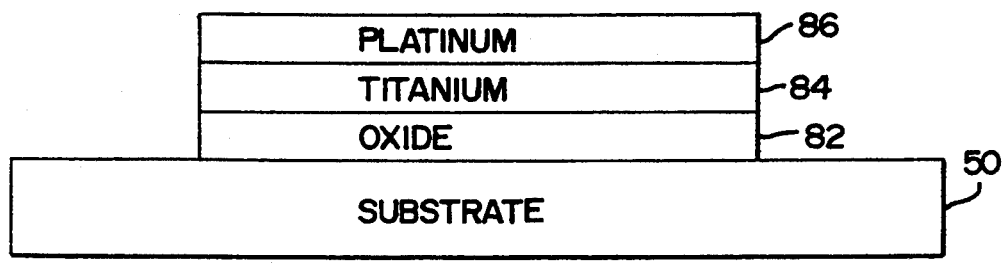
FIGS. 10A through 10C are cross sectional diagrams showing the sequential evolution of a ferroelectric capacitor structure during a fabrication process, wherein the ferroelectric dielectric material is fabricated according to the method of the present invention.
Figure 10B:
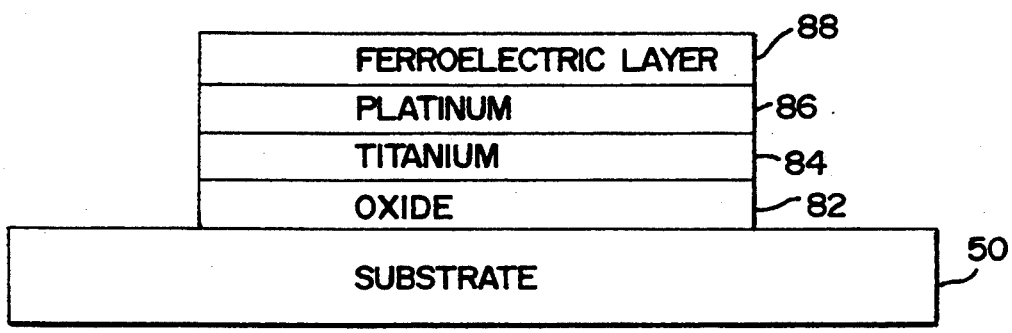
Figure 10C:
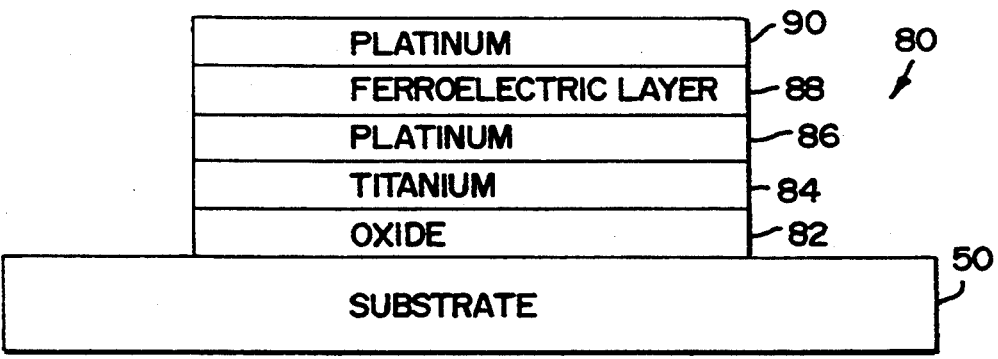

A series of fabrication steps is shown in the cross sectional diagrams of FIGS. 10A-C, in which the sputtering deposition method of the present invention is used to produce a ferroelectric capacitor dielectric layer 88 for a non-volatile memory element in an integrated circuit. The capacitor stack 80 shown in FIGS. 10C is a desirable arrangement of material layers for making a ferroelectric capacitor in a process compatible with conventional integrated circuit CMOS fabrication techniques.

In FIG. 10A a bottom electrode is deposited by sputtering onto an oxide layer 82 of a semiconductor wafer substrate 50. The oxide layer 82 is preferably about 5000 Angstroms thick. A bottom electrode structure is comprised of a titanium adhesion layer 84, which is about 200 Angstroms thick and deposited on the surface of the oxide layer 82. A platinum layer 86, which is about 1750 Angstroms thick is deposited onto the surface of the titanium adhesion layer 84, and forms the surface of the bottom electrode for subsequent interface to a ferroelectric film layer formed according to the method of the present invention.

In FIG. 10B, a layered film 88 is then established as a dielectric layer over the bottom electrode as described in any of the previous methods. The layered film 88 is desirably about 2000 Angstroms thick. The layered film 88 is converted to a ferroelectric film after crystallizing anneal is performed.

In FIG. 10C, a top electrode 90 is deposited by sputtering onto the layered dielectric film 88 and is preferable comprised of platinum. The top electrode layer 90 is desirably about 1750 Angstroms thick.

Figure 11:
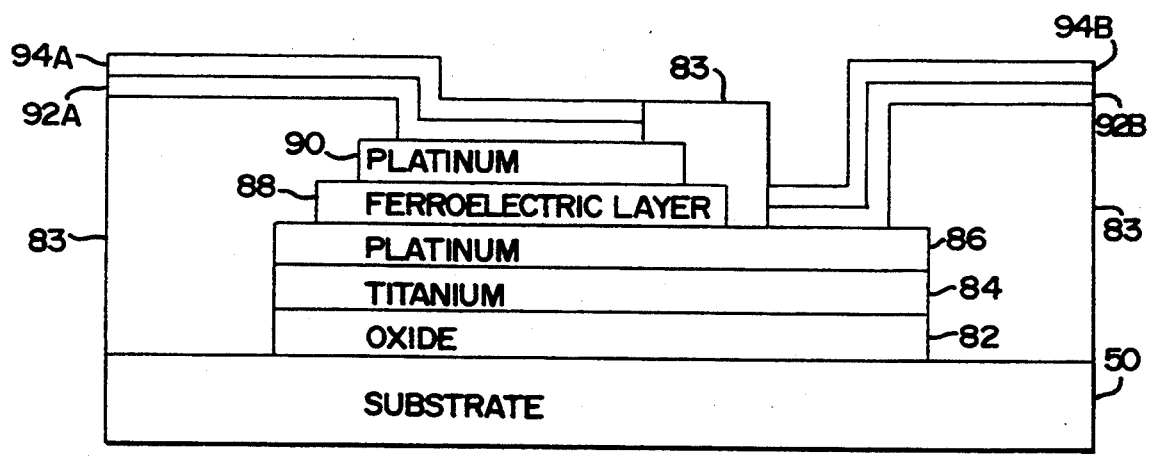
FIG. 11 is a cross sectional diagram of a ferroelectric capacitor structure according to the present invention fabricated in an integrated circuit, wherein the top and bottom electrodes of the ferroelectric capacitor are contacted by a metallization layer.

A more realistic rendering of an integrated circuit ferroelectric capacitor in which the dielectric was formed according to the techniques of the present invention is shown in FIG. 11. Note that the order of layers 82–90 is unchanged, but that the ferroelectric layer is etched back from the bottom electrode, and the top electrode layer is etched back from the ferroelectric dielectric layer 88. In addition, oxide isolation features 83 are included to electrically isolate an integrated circuit metallization consisting of layers 92 and 94. Metallization layer portions 92A and 94A form the metallization for the top electrode of the capacitor, and metallization layer portions 92B and 94B form the metallization for the bottom electrode of the capacitor as shown in FIG. 10. The bottommost layers 92A and 92B are formed of titanium nitride (TiN), about 1000 Angstroms thick. The titanium nitride layer acts as a barrier layer for the uppermost layers 94A and 94B, which are formed of aluminum, about one micron thick. At elevated temperatures, the platinum top electrode layer 90 must be separated from the aluminum metallization layer 94; otherwise a thermally unstable alloy material can result.

The capacitor ferroelectric characteristics can now be measured by contacting the top and bottom electrodes through metallization layers 94A and 94B, respectively, with electrical test measurement equipment. Alternatively, the metallization can be omitted and the structure of FIG. 9C can be contacted directly. The bottom electrode contact is available at the edge of the wafer as a portion of top electrode beneath clamps used in the top electrode etch. The sputter deposition process for the top electrode effectively coats the wafer sides. Consequently, the unetched top electrode regions at the wafer edge serve as bottom electrode contacts.

Having described and illustrated the principles of the invention in a preferred embodiment thereof, it is appreciated by those having skill in the art that the invention can be modified in arrangement and detail without departing from such principles. For example, bismuth layered oxide compounds are desirably fabricated with the method of the present invention, but the method is not limited to fabrication of dielectric layers using those compounds. Any other type of ferroelectric material such as PZT or others can be fabricated using the multiple-target method of the present invention, although the method of the present invention may not confer any benefits for some of these materials. Also, it should be clear to those skilled in the art that the details of the sputtering deposition hardware and the attendant scanning program can be modified as desired for compatibility with other hardware, or to suit a particular application. We therefore claim all modifications and variation coming within the spirit and scope of the following claims.

We claim:

1. A method of forming a ferroelectric film on a substrate comprising the steps of:
   (a) depositing a layer of a first material that includes at least one of the constituent elements of a desired ferroelectric film material;
   (b) depositing a layer of a second material including at least one of the constituent elements of the desired ferroelectric film material, wherein the first and second materials contain in combination all of the constituent elements of a desired ferroelectric film material;
   (c) repeating steps (a) and (b) until a film is formed of alternating discrete individual layers of the first and second materials that attains a predetermined film thickness, wherein the thickness of a layer pair comprised of a single layer of the first material and a single layer of the second material is between 50 and 200 Angstroms; and
   (d) annealing the film so that it is converted into a ferroelectric film.

2. The method of claim 1 in which the step of depositing a layer of the first material comprises the step of sputtering a layer of the first material.

3. The method of claim 1 in which the step of depositing a layer of the second material comprises the step of sputtering a layer of the second material.

4. The method of claim 1 in which the step of depositing a layer of the first material comprises the step of depositing a layer of bismuth oxide.

5. The method of claim 1 in which the step of depositing a layer of the second material comprises the step of depositing a layer of a material containing strontium, bismuth, and tantalum.

6. The method of claim 1 in which the step of depositing a layer of the second material comprises the step of depositing a layer of a material containing strontium and tantalum.

7. A method of forming a ferroelectric film on a substrate comprising the steps of:
   (a) depositing a layer of a first material that includes at least one of the constituent elements of a desired ferroelectric film material;
   (b) depositing a layer of a second material including at least one of the constituent elements of the desired ferroelectric film material;
   (c) depositing a layer of a third material that includes at least one of the constituent elements of the desired ferroelectric film material;
   (d) depositing a layer of a fourth material including at least one of the constituent elements of the desired ferroelectric film material, wherein the first, second, third, and fourth materials contain in combination all of the constituent elements of a desired ferroelectric film material;
   (e) repeating steps (a), (b), (c), and (d) until a film is formed of alternating layers of the first, second, third, and fourth materials that attains a predetermined film thickness; and
   (f) annealing the film so that it is converted into a ferroelectric film.

8. The method of claim 7 in which the step of depositing a layer of the first material comprises the step of sputtering a layer of the first material.

9. The method of claim 7 in which the step of depositing a layer of the second material comprises the step of sputtering a layer of the second material.

10. The method of claim 7 in which the step of depositing a layer of the third material comprises the step of sputtering a layer of the third material.

11. The method of claim 7 in which the step of depositing a layer of the fourth material comprises the step of sputtering a layer of the fourth material.

12. The method of claim 7 in which the step of depositing a layer of the first material comprises the step of depositing a layer of bismuth oxide.

13. The method of claim 7 in which the step of depositing a layer of the second material comprises the step of depositing a layer of a material containing strontium, bismuth, and tantalum.

14. The method of claim 7 in which the step of depositing a layer of the third material comprises the step of depositing a layer of bismuth oxide.

15. The method of claim 7 in which the step of depositing a layer of the fourth material comprises the step of depositing a layer of a material containing strontium and tantalum.

16. A method of forming a ferroelectric film on a wafer comprising the steps of:
   (a) positioning the wafer underneath a first target including at least one of the constituent elements of a desired ferroelectric film material, such that the wafer and the first target are not coaxial;
   (b) sputtering a layer of material from the first target onto the wafer;
   (c) subsequently positioning the wafer underneath a second target including at least one of the constituent elements of a desired ferroelectric film material, such that the wafer and the second target are not coaxial;
   (d) sputtering a layer of material from the second target onto the wafer;
   (e) repeating steps (a) through (d) until a film is formed of alternating layers of the first and second materials that attains a predetermined film thickness; and
   (f) annealing the film so that it is converted into a ferroelectric film.

17. The method of claim 16 in which step (b) comprises the step of sputtering a layer of bismuth oxide.

18. The method of claim 16 in which step (d) comprises the step of sputtering a layer of a material containing strontium, bismuth, and tantalum.

19. The method of claim 16 in which step (d) comprises the step of sputtering a layer of a material containing strontium and tantalum.

20. A method of forming a ferroelectric film comprising the steps of:
   forming a layered thin film including layers containing at least one of the constituent elements of a desired ferroelectric film material each separated by a layer of bismuth oxide; and
   annealing the layered thin film so that it is converted into a ferroelectric film.

* * * * *